United States Patent
Guelzow et al.

(10) Patent No.: US 7,893,705 B2
(45) Date of Patent: Feb. 22, 2011

(54) MODULE FOR TEST DEVICE FOR TESTING CIRCUIT BOARDS

(75) Inventors: Andreas Guelzow, Springe (DE); Victor Romanov, Wertheim (DE); Volker Goldschmitt, Wertheim (DE); Werner Mueller, Wiesenbronn (DE); Ruediger Dehmel, Wunstorf (DE); Uwe Rothaug, Marktheidenfeld (DE)

(73) Assignee: atg Luther & Maelzer GmbH, Wertheim/Reicholzheim (DE)

( * ) Notice: Subject to any disclaimer, the term of this patent is extended or adjusted under 35 U.S.C. 154(b) by 0 days.

(21) Appl. No.: 12/484,510

(22) Filed: Jun. 15, 2009

(65) Prior Publication Data

US 2009/0251161 A1  Oct. 8, 2009

Related U.S. Application Data

(63) Continuation of application No. PCT/EP2007/062888, filed on Nov. 27, 2007.

(30) Foreign Application Priority Data

Dec. 15, 2006  (DE) .................. 10 2006 059 429

(51) Int. Cl.
*G01R 31/02* (2006.01)
(52) U.S. Cl. ............................. 324/757.02; 324/755.08
(58) Field of Classification Search ......... 324/754–758, 324/765
See application file for complete search history.

(56) References Cited

U.S. PATENT DOCUMENTS 3,564,408 A    2/1971   Schulz et al.

(Continued)

FOREIGN PATENT DOCUMENTS

DE    32 40 916 A1    5/1984

(Continued)

OTHER PUBLICATIONS

International Search Report dated May 30, 2008, from counterpart International Application No. PCT/EP2007/062888 filed on Nov. 27, 2007.

(Continued)

*Primary Examiner*—Ha Tran T Nguyen
*Assistant Examiner*—Joshua Benitez
(74) *Attorney, Agent, or Firm*—Houston Eliseeva LLP

(57) ABSTRACT

A module for a tester for the testing of circuit boards is described. Such testers have a basic grid on which an adapter and/or a translator may be arranged in order to connect contact points of the basic grid with circuit board test points of a circuit board to be tested. The module comprises a support plate and a contact board. The contact board is formed by a rigid circuit board section which is described as the basic grid element, and at least one flexible circuit board section. Provided on the basic grid element are contact points which each form part of the contact points of the basic grid. The basic grid element is mounted at an end face of the support plate, and the flexible circuit board section is bent in such a way that at least part of the other section of the contact board is parallel to the support plate. Each of the contact points of the basic grid element is in electrical contact with conductor paths running in the contact board and extending from the basic grid element into the flexible circuit board section.

21 Claims, 6 Drawing Sheets

U.S. PATENT DOCUMENTS

| | | | |
|---|---|---|---|
| 4,417,204 A | 11/1983 | Dehmel et al. | |
| 4,674,006 A | 6/1987 | Driller et al. | |
| 4,724,377 A | 2/1988 | Maelzer et al. | |
| 4,724,379 A | 2/1988 | Hoffman | |
| 4,908,576 A | 3/1990 | Jackson | |
| 5,506,510 A | 4/1996 | Blumenau | |
| 5,672,978 A * | 9/1997 | Kimura | 324/754 |
| 6,066,957 A * | 5/2000 | Van Loan et al. | 324/758 |
| 6,150,825 A | 11/2000 | Prokopp et al. | |
| 6,297,652 B1 * | 10/2001 | Shimoda et al. | 324/754 |
| 6,441,636 B1 | 8/2002 | Prokopp | |
| 6,445,173 B1 | 9/2002 | Weiss | |
| 6,720,787 B2 * | 4/2004 | Kimura et al. | 324/765 |
| 7,038,471 B2 * | 5/2006 | Kimura et al. | 324/691 |
| 7,095,241 B2 * | 8/2006 | Setaka et al. | 324/754 |
| 7,190,180 B2 * | 3/2007 | Yamada et al. | 324/754 |
| 7,311,531 B2 * | 12/2007 | Igarashi et al. | 439/91 |
| 7,323,712 B2 * | 1/2008 | Kokubo et al. | 257/48 |
| 2004/0021480 A1 | 2/2004 | Doherty et al. | |

FOREIGN PATENT DOCUMENTS

| | | |
|---|---|---|
| DE | 33 40 180 C1 | 5/1985 |
| DE | 88 06 064 U1 | 9/1989 |
| DE | 196 27 801 C1 | 3/1998 |
| EP | 0 818 684 A2 | 1/1998 |
| EP | 0 875 767 A2 | 11/1998 |
| EP | 1 083 434 A2 | 3/2001 |
| EP | 1 322 967 B1 | 1/2002 |
| WO | 89/05089 A1 | 6/1989 |
| WO | 00/26681 A1 | 5/2000 |
| WO | 02/31516 A1 | 4/2002 |

OTHER PUBLICATIONS

English Translation on International Preliminary Report on Patentability mailed Jul. 16, 2009, from counterpart International Application No. PCT/EP2007/062888, filed Nov. 27, 2007.

* cited by examiner

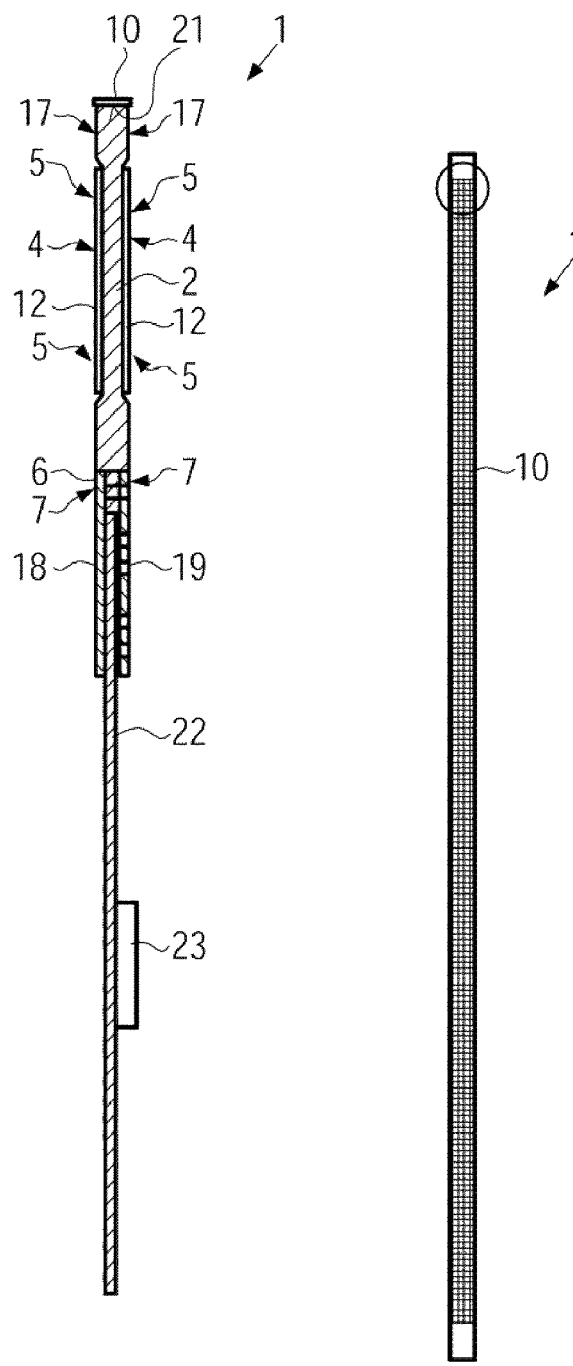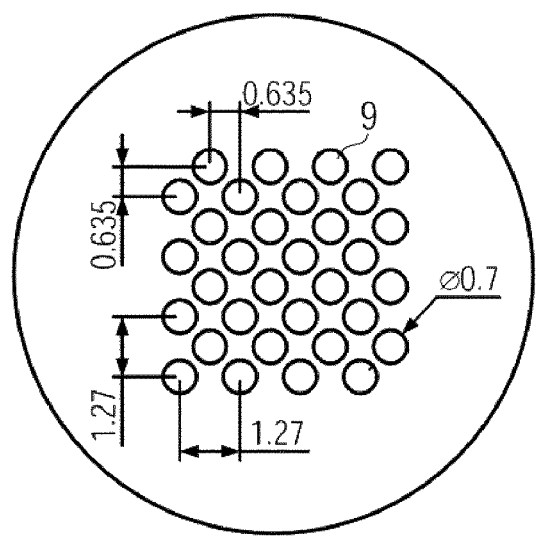
FIG. 1   FIG. 2a
FIG. 2b

MODULE FOR TEST DEVICE FOR TESTING CIRCUIT BOARDS

RELATED APPLICATIONS

This application is a Continuation of International application number PCT/EP2007/062888, filed on Nov. 27, 2007 which claims priority to German Patent Application No. DE 10 2006 059 429.0, filed on Dec. 15, 2006, both of which are incorporated herein by reference in their entirety.

BACKGROUND OF THE INVENTION

Devices for the testing of electrical circuit boards are known for example from U.S. Pat. No. 3,564,408 and U.S. Pat. No. 4,417,204 respectively. These devices have a contact board on which test probes are arranged in a basic grid. The test probes are connected to a test circuit over long cables. The circuit boards to be tested are placed on the test board, and an adapter may be fitted between the circuit board and the test board so that an electrical contact is made between each test point of the circuit board to be tested and a test probe.

From this type of tester, modular testers have been developed, such as those described in patents DE 32 40 916 C2 and DE 33 40 180 C1. This type of tester has a motherboard on which rest vertically arranged modules, each comprising a part of the electronic test circuit and having vertically aligned test probes at their upper ends. In a tester, several such modules are mounted alongside one another, with the array of test probes forming a contact array replacing the contact board. So that the modules hold together well, a perforated board may be slipped over the test probes, with each test probe passing through a hole in the perforated board, thereby being fixed in position.

This modular structure of the contact array has proven to be very successful in practice. A major advantage of this modular structure is that the contact pressure applied in the testing of a circuit board is transmitted via the modules to the motherboard.

Known from utility-model patent DE 88 06 064 U1 is a further tester in which the contact array is modular in form. These modules are strip-shaped with each having, for example, four rows of square pads or contact faces. Here it is disclosed that the pads are arranged in a grid with a grid dimension of, for example, 0.5-2 millimeters (mm). These modules with such a dense arrangement of pads have not proved successful in practice since, on the one hand, owing to the high number of contact points the can only be read by very large and therefore expensive evaluation electronics, and on the other hand the embodiment described in DE 88 06 064 with a vertically placed circuit board, on the end face of which the contact points are formed directly, gives considerable problems in series production.

EP 0 875 767 A2 discloses a tester which is provided with evaluation electronics with a number of test connections. This tester has a basic grid formed by a multilayer circuit board with contact points arranged in a grid on its upper side. Several of these contact points are electrically connected to one another by means of scan channels running in the circuit board of the basic grid. On the basic grid rests an adapter and/or a translator on which a circuit board to be tested may be placed. The adapter and/or translator makes an electrical contact between circuit board test points on the circuit board and the contact points of the basic grid.

EP 1 322 967 B1 discloses another module for a tester for the testing of circuit boards. This has a strip-shaped section with contact points, which forms part of a basic grid of the tester. Arranged below the strip-shaped section is an upright board on which are mounted some of the evaluation electronics for the evaluation of test signals. The contact points on the strip-shaped section are arranged in a grid with a grid spacing of no more than 2 mm, and at least two contact points of a module are electrically connected to one another in such a way that the electrically connected contact points are in contact with a single input of an electronics unit.

Described in EP 1 083 434 A2 and U.S. Pat. No. 6,445,173 B1 respectively is another device for the testing of circuit boards, in which the basic grid is formed by circuit boards standing at right-angles to the plane of the basic grid. These circuit boards, which are described as basic grid circuit boards have, on their narrow-side faces lying in the plane of the basic grid, contact points which represent the contact elements of the basic grid. These contact points are connected to conductor paths which extend over one side face of the basic grid circuit boards. These basic grid circuit boards are in the form of multilayer circuit boards in which conductor paths running at right-angles to one another are arranged at different levels to form a matrix. At the crossovers of these conductor paths running at right-angles to one another they may be connected electrically by means of a via hole. Using these via holes and the matrix, selected contact points of the basic grid may be connected electrically with one another, so that the contact points connected to one another require only a single connection to evaluation electronics. Since the conductor paths of this matrix are distributed over a fairly large area of the basic grid circuit boards, they are much more easily provided than the scan channels known from EP 0 875 767 A2 referred to above.

Formerly the maximum density of the contact points of a basic grid of a commercially-available tester was 62 contact points per square centimeter, corresponding to a square grid with an edge length of 1.27 mm.

It is true that there are also testers on the market with a higher contact point density (double or four times). To date, however, these have been technically very complex and therefore expensive, and consequently have been made only in very low volumes.

For testers with basic grids, the parallel testers, the density of basic grid contact points should be further increased. This makes the production of such basic grids difficult, in particular if certain contact points of the basic grid are to be electrically interconnected. In the case of the basic grid circuit boards known from EP 1 083 434 A2, the production of such closely adjacent contact points on the narrow-side faces of the basic grid circuit boards is difficult. In the case of the modules with basic grids described above, with contact points which are electrically interconnected, it is difficult to implement the electrical connection of selected contact points if a further increase in contact point density is desired.

If for example it is desired that the density of contact points be doubled (64 contact points per square centimeter), this is not possible using the known methods. Therefore, to form the basic grid according to EP 0 875767 A2, it would be necessary to provide a basic grid circuit board with 48 layers. It is not possible to make such a circuit board reliably today using current production methods. It is virtually impossible for such a circuit board to have all its connections made correctly. A defective basic grid, however, is not acceptable in a tester.

A further problem which arises when the density of contact points in a basic grid is increased is the increasing mechanical pressure load on the basic grid. The pressure is proportional to the number of contact points. If the contact points are doubled, there is a corresponding increase in pressure.

SUMMARY OF THE INVENTION

The present invention relates to a module for a tester for the testing of circuit boards, together with a device for the testing of circuit boards.

The invention is based on the problem of creating a module for a tester for the testing of circuit boards which permits an increased density of contact points on the basic grid, while also facilitating simple connection of selected contact points of the basic grid.

The module according to the invention for a tester for the testing of non-componented circuit boards is provided for a tester which has a basic grid on which an adapter and/or a translator may be arranged in order to connect contact points of the basic grid with circuit board test points of a circuit board to be tested. The module comprises a support plate and a contact board. The contact board is formed by a rigid circuit board section which is described as the basic grid element, and at least one flexible circuit board section. Provided on the basic grid element are contact points which each form part of the contact points of the basic grid and are arranged with a density of at least 100 contact points per square centimeter. The basic grid element is mounted at right-angles to the respective support plate at an end face of the support plate, and the flexible circuit board section is bent in such a way that at least part of the other section of the contact board is roughly parallel to the support plate. Each of the contact points of the basic grid element is in electrical contact with a conductor path running in the contact board and extending from the basic grid element into the flexible circuit board section.

Because the basic grid element is made from a rigid circuit board section, the contact points of the basic grid may be provided in the usual manner at any desired density. Since the basic grid element is connected to a flexible circuit board section, in which run conductor paths connected to the contact points of the basic grid element and extending into the flexible circuit board section, there is plenty of space available on planes at right-angles to the basic grid for the electrical connection to one another of selected conductor paths and thus selected contact points of the basic grid. These connections may also be realized by a combination of conductor paths running in the contact board and the support plate or in another circuit board. Since there is a great deal of space in the plane at right-angles to the plane of the basic grid, it is also possible in principle to lead the conductor paths connected to the contact points of the basic grid to evaluation electronics without individual conductor paths and therefore the corresponding contact points being electrically interconnected. A disadvantage of such an embodiment however is that the capacity of the evaluation electronics must be increased to match the number of contact points of the basic grid.

Through the provision of the flexible circuit board section, the conductor paths connected to the contact points are bent from the plane parallel to the basic grid into a plane roughly at right-angles to the basic grid. Here it is easy to form a matrix of conductor paths running at right-angles to one another, with certain crossovers being connected selectively by means of via holes. These connections may however also be made in a different manner. For example the individual conductor paths connected to the contact points of the basic grid may be joined by connections of one or more multiplexers and logic modules (Asics, FPGA), in which a suitable interconnection matrix is wired. Here the use of FPGAs is especially advantageous, since the connection or interconnection of the contact points of the basic grid may be altered at any time.

In a preferred embodiment of the invention the contact board has two flexible circuit board sections, with the basic grid element located between the two flexible circuit board sections.

According to a further aspect of the present invention, the contact board is in the form of a flexible circuit board extending over the whole area of the contact board, on which are placed one or more rigid circuit board sections, with the provision of via holes extending through both the rigid circuit board sections and also the flexible circuit board, so that electrical connections exist between contact points and conductor paths in the two different types of circuit board.

The contact board may also be provided with one or more other rigid circuit board sections, which are described as channel sections. The channel sections have several conductor paths, running at right-angles to the conductor paths connected to the contact points of the basic grid element, which form scan channels and are selectively connected electrically by means of via holes to the conductor paths leading to the contact points of the basic grid element.

In an alternative embodiment, a matrix of conductor paths running at right-angles to one another may also be provided within the support plate, while at specific crossovers of these conductor paths via holes are formed in such a way that the specific contact points of the basic grid element are electrically connected to one another.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 1 is a drawing of a module according to the invention in cross-section;

FIG. 2a is a top view of the module of FIG. 1;

FIG. 2b is an enlarged detail from the top view of FIG. 2a;

DETAILED DESCRIPTION OF THE PREFERRED EMBODIMENTS

Figure 3:
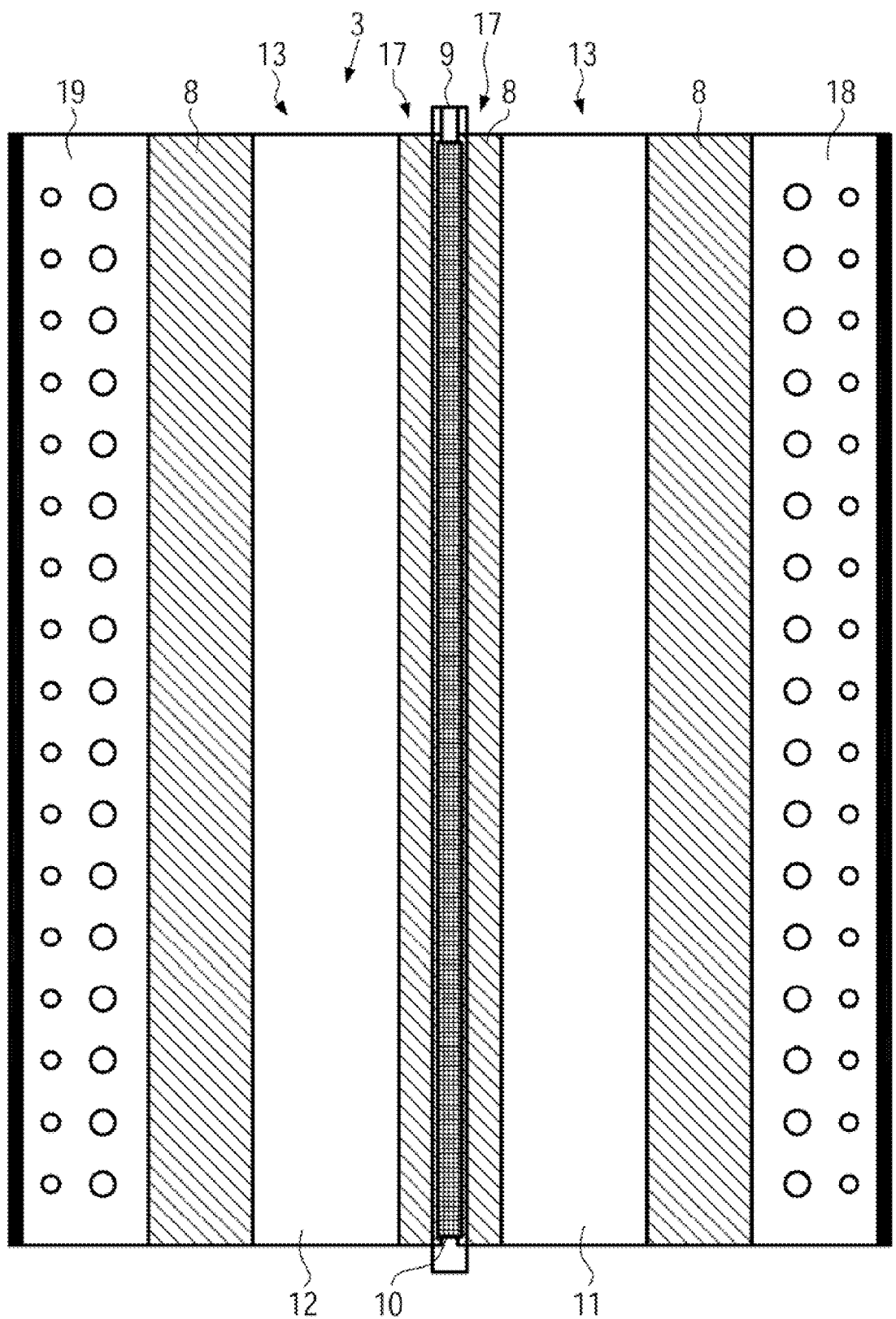
FIG. 3 is a contact board in stretched condition, which is part of the module of FIG. 1.

FIGS. 1 to 4 show a first embodiment of a module according to the invention for a tester for the testing of non-componented circuit boards. The module 1 is made up of a support plate 2 and a contact board 3.

The support plate 2 is a long, elongated rectangular plate made of steel with a length of around 30 centimeters (cm) and a height of around 6 cm. At its top and bottom edges it is roughly 4 to 5 mm thick. Provided on the side faces 4 of the support plate 2 are flat recesses 5 which extend over the entire length of the support plate 2. These trough-shaped recesses 5 have a depth of around 1 mm and a width of around 3 to 4 cm.

Figure 4:
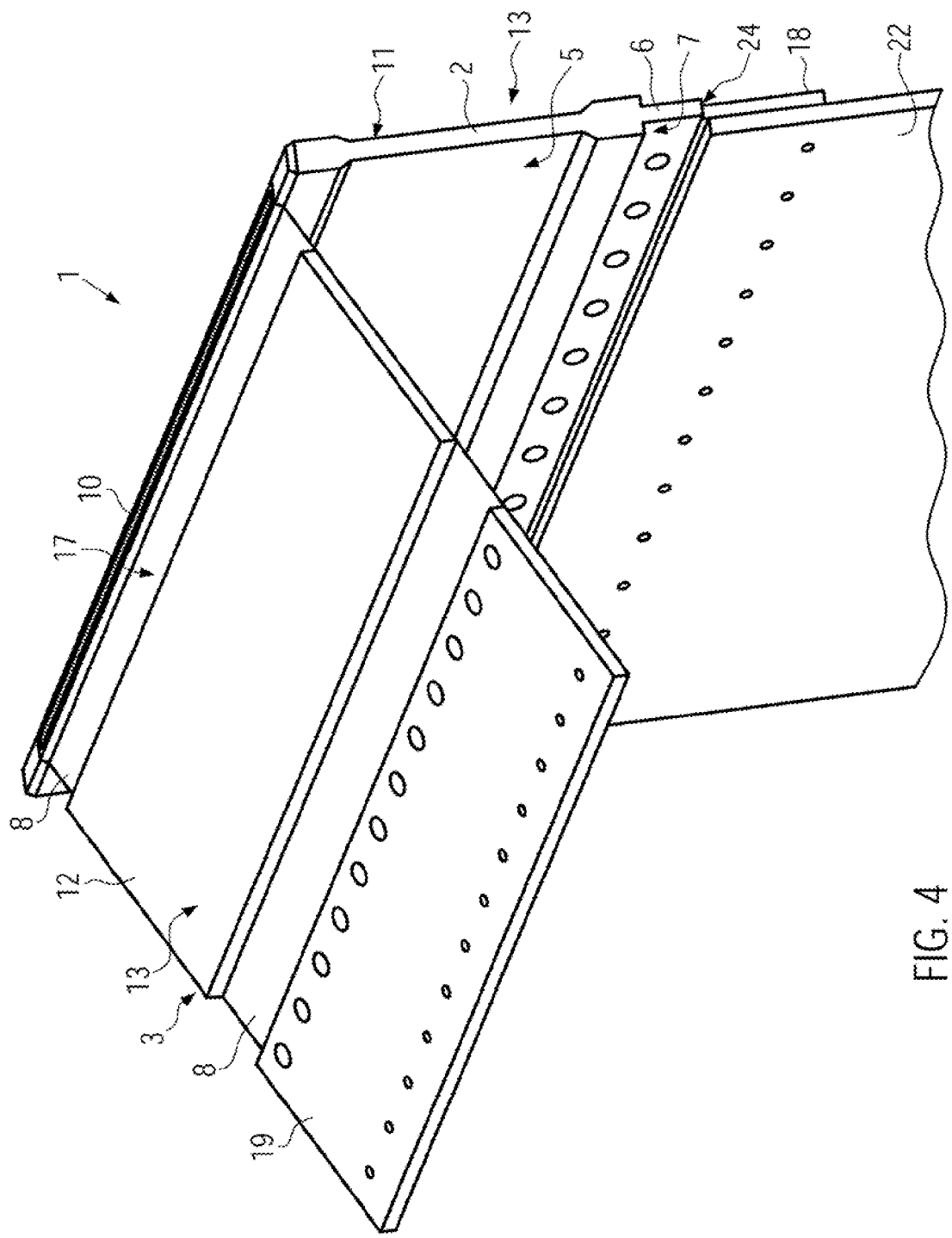
FIG. 4 is the module according to the invention, with a contact board shown separately from a support plate.

At the bottom edge of the support plate 2 is a centrally located web 6 extending downwards (FIGS. 1, 4). The web 6 and the downwards facing end face of the support plate 2 define two rebounds or steps 7, each holding an edge of a contact strip, as will be explained in more detail below.

The contact board 3 is in the form of a flexible circuit board 8 which extends over the whole area of the contact board 3. In FIG. 3 the contact board 3 is shown in stretched condition. Attached to the flexible circuit board 8 is at least one rigid circuit board 10 containing the contact points 9 in a predetermined grid on the side facing away from the flexible circuit board 8. This rigid circuit board forms a basic grid element 10 which represents a section of a basic grid of a parallel tester for the testing of componented circuit boards. This basic grid element 10 is elongated and strip-shaped, with a width of e.g. around 5 mm and a length of around 26 cm. At each of its end sections, the basic grid element 10 extends slightly beyond the flexible circuit board 8. This rigid circuit board is bonded flat to the flexible circuit board, with for example a fiber-reinforced adhesive resin (prepreg). Also provided in the basic grid element are via holes (not shown), each extending from the individual contact points 9 through the rigid circuit board into the flexible circuit board 8, where they are each connected to a conductor path 14 (FIG. 5).

The contact points are circular in shape since they are made by filling with gold the holes bounding the via holes. They have a diameter of 0.7 mm. The grid in which the contact points 9 are arranged is made up of two square grids interlaced with one another. In the square grids the contact points 9 are each spaced roughly 1.27 mm apart from one another, with one contact point 9 located at each corner point of a square. In the center between four contact points 9 of a grid arranged at the corners of a square, in each case a contact point of the other square grid is provided. These two grids are therefore offset relative to one another by half the distance between two adjacent contact points of a grid. This half-distance is 0.635 mm (FIG. 2b). The density of the contact points of this grid is 124 contact points per square centimeter and is thus twice the maximum density of contact points of a basic grid of testers in common use to date. Basic grids with such a high density of contact points are used for the testing of non-componented circuit boards, since with non-componented circuit boards it is necessary to contact a multiplicity of circuit board test points simultaneously. This module is therefore provided for the testing of non-componented circuit boards.

The contact board 3 has two more rigid circuit boards 11, 12, mounted either side of the basic grid element 10 with clearance from it. These sections of the contact board 3 with the rigid circuit boards 11, 12 are described as channel sections 13.

Figure 5:
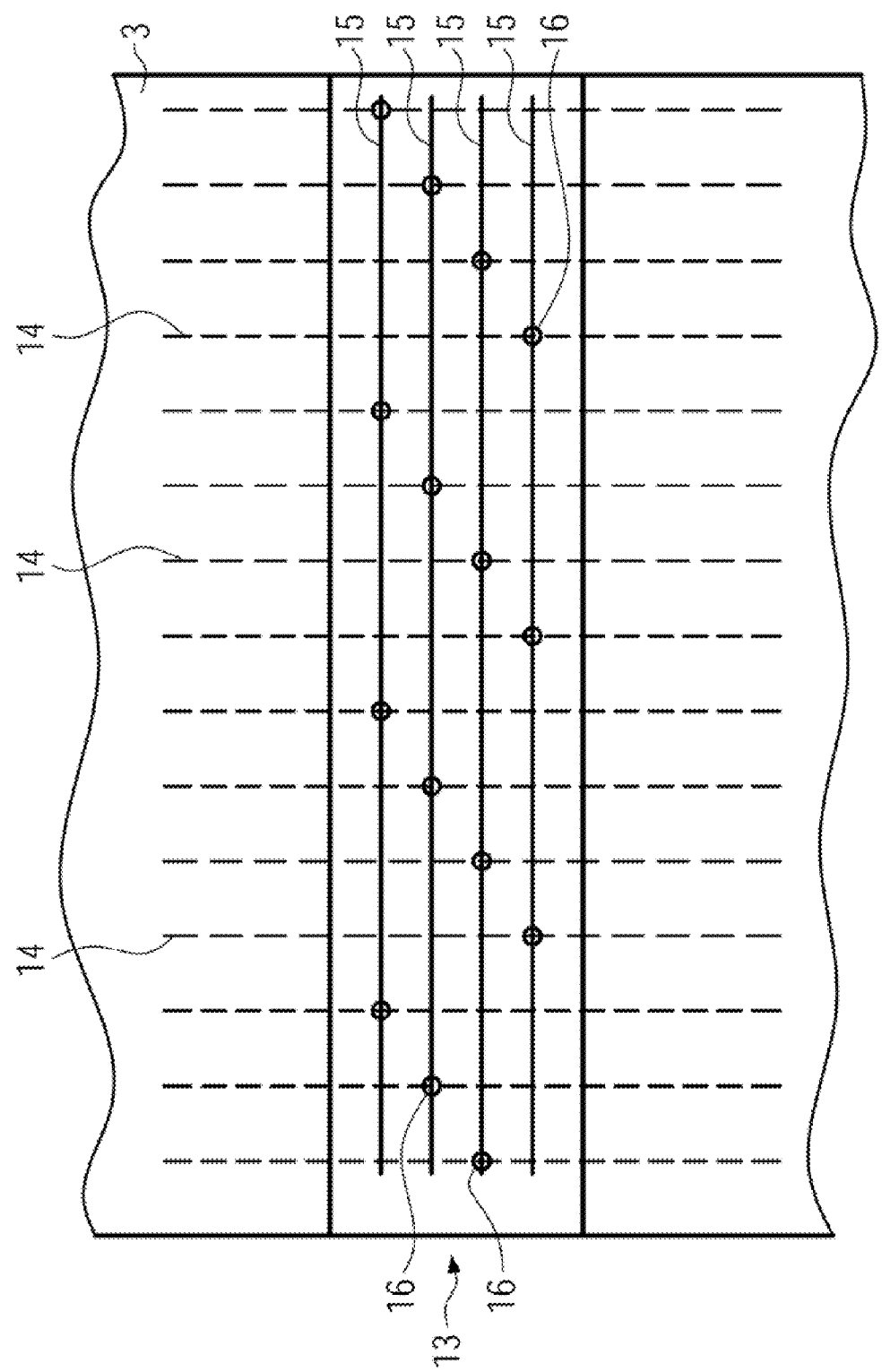
FIG. 5 is a detailed view of the contact board of the module of FIG. 1 in the area of a channel section.

FIG. 5 shows a detail of such a channel section 13 and adjacent areas of the contact board 3. In the flexible circuit board 8 run conductor paths 14, each connected to a contact point 9 and extending at least into one of the channel sections 13. Provided in the rigid circuit board of the channel section 13 are conductor paths 15 running at right-angles to the conductor paths 14 and described as scan channels 15. Provided at certain crossovers between the scan channels 15 and the conductor paths 14 of the flexible circuit board 8 are via holes 16, each connecting a conductor path 14 to a scan channel 15. Here each scan channel 15 is connected by means of several via holes 16 to several conductor paths 14. Groups of conductor paths 14 and groups of contact points 9 respectively are therefore connected electrically with one another via the scan channels 15. With regard to the interconnection of the contact points, reference is made to the full contents of EP 0 875 767 A2 and EP 1 083 434 A2.

FIG. 5 shows only a few conductor paths 14 and scan channels 15 in schematic form. Typically 64, 128 or 256 groups of electrically interconnected conductor paths and a corresponding number of scan channels 15 are provided. The number of these groups may vary according to the application. Typically the number of groups of interconnected conductor paths lies in the range of 50 to 500 and preferably in the range of 100 to 300.

The channel section is preferably designed in such a way that in each case two, three, four or five conductor paths 14 are linked to one another. By this means the number of connections is halved or even reduced to a fifth, compared to the number of contact points of the basic grid.

Due to the fact that the interconnection of the contact points 9 by means of the interconnection of the conductor paths 14 is effected in a plane at right-angles to the basic grid, much more space is available than in the mode of interconnection according to EP 0 875 767 A2. The interconnection is therefore much simpler and more cost-effective. Moreover a distinctly greater number of contact points 9 may be safely and reliably interconnected.

In the present embodiment, there is provided in the channel section 13 an additional rigid circuit board 11, 12, bonded over its full surface to the flexible circuit board 8 by a prepreg bond. With the rigid circuit board 11, 12 at least one further layer is provided, in which conductor paths (scan channels) may be formed. Instead of a rigid circuit board it is of course possible to use a multilayer flexible circuit board 8. The use of a rigid circuit board is however more cost-effective, and also the via holes may be made more easily and reliably in a rigid circuit board.

In the present embodiment, the scan channels 15 are connected to the conductor paths 14 by means of via holes 16. Within the scope of the invention it is however also possible for the channel section 13 to be in the form of a circuit board in which the scan channels are conductor paths in contact with contact points lying on the surface of the channel section. On joining the circuit board forming the channel section to the flexible circuit board, the contact points of the channel section are soldered to corresponding contact points of the flexible circuit board which are in turn in contact with the conductor paths 14. Such an embodiment is expedient when the groups of conductor paths to be interconnected electrically comprise only a small number of conductor paths 14, for example two or three conductor paths.

The channel sections 13 are arranged with clearance from the basic grid element 10, so that in each case a flexible section 17 of the contact board 3 is formed between the channel sections 13 and the basic grid element 10. The channel sections 13 are arranged symmetrically to the basic grid element 10, so that the two flexible sections 17 are of equal width.

Provided at the ends of the contact board 3 furthest from the basic grid element 10 are contact strips 18, 19. The contact strips 18, 19 extend along the entire edge of the flexible circuit board 8 and protrude slightly at the ends of the flexible circuit board 8. The contact strips 18, 19 are in the form of strip-shaped rigid circuit boards, which are bonded to the flexible circuit board 8. Formed on the contact strips 18, 19 are contact points (not shown, since they are located on the reverse of the contact board 3 in FIG. 3) connected to conductor paths 14 running in the flexible circuit board 8. However, not every conductor path 14 of the flexible circuit board 8 is led to a contact point but instead, from a group of conductor paths 14 which may be interconnected via the scan channels, just a single conductor path is electrically connected to a contact point. Because of this, the total number of contact points of the contact strips 18, 19 is significantly less than the number of contact points 9 of the basic grid element 10.

The contact board 3 is connected to the support plate 2 in such a way that the basic grid element 10 is located at one end face 21 of the support plate 2 and the adjacent flexible sections 17 are bent in such a way that the contact board 3 with the areas bordering it runs roughly parallel to the side faces of the support plate 2.

In the present embodiment the contact board 3 is bonded over its whole surface to the support plate 2, with the channel sections 13 being provided in the recesses 5 of the support plate 2. Each of the contact strips 18, 19 is inserted by an edge section into one of the two steps 7 of the support plate 2, extending downwards a little beyond the web 6 and therefore defining between them a gap-like interspace. In the area of the web 6 the contact strips 18, 19 are fastened to the support plate 2 by means of a screw connection. Located in the interspace between the two contact strips 18, 19 is the edge of a circuit board 22 which extends a good distance downwards compared to the contact strips 18, 19. In that part of it which is in contact with the contact strips 18, 19, this circuit board 22 has contact points which are soldered to the corresponding contact points of the contact strips 18, 19. Since here, in contrast to the basic grid element, there is plenty of space available and the contact points have a large area and are arranged in a rough grid, they may be soldered relatively easily. In principle, though, there are also other means of contacting the contact points of the contact strips 18, 19 and the contact points of the circuit board 22. For example small spring contacts could be provided between the contact strips and the circuit board.

The contact strips 18, 19 are screwed to the circuit board 22 so that adequate mechanical stability is ensured.

Integrated circuits 23 are provided on the circuit board 22, in examples, to form part of the evaluation electronics by which the measuring signals are generated and evaluated. It is however equally possible for the circuit board 22 to be without such components, and for the circuit board 22 to be provided only with wires connected to the evaluation electronics. The connection of the evaluation electronics is effected preferably via plug connectors (not shown) provided in the tester, and into which the lower edge of the circuit boards 22 is plugged.

The support plate 2 protrudes slightly from the side of the contact board 3. The bottom edge of the protruding sections of the support plate 2 forms supports 24 (FIG. 4) which rest upon suitable support rails (not shown) in the tester and absorb the entire compressive force of the tester which bears on the basic grid. Due to the design of the module 1 with a stable support plate 2 which conducts the entire compressive force of the tester to the support rails, the circuit board 22 is free from mechanical loading. By this means, in the area below the basic grid, the mechanical load is separated at an early stage from the electrical circuitry, making it easy to provide the circuit board 22 with further function elements, since it is not subject to any mechanical loading.

Figure 6:
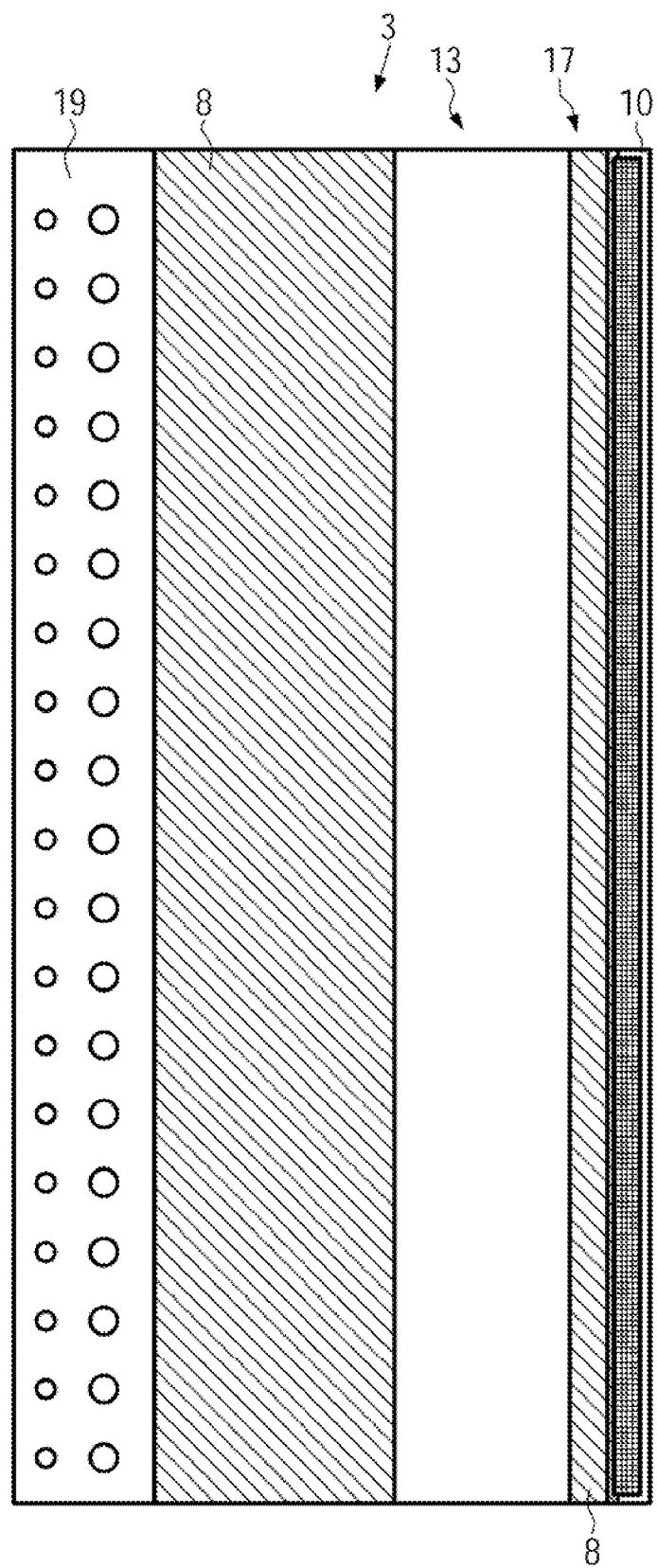
FIG. 6 is a contact board, in stretched condition, of another embodiment of the module according to the invention.

FIG. 6 shows an alternative embodiment of the contact board 3. This contact board too has a flexible circuit board 8, a basic grid element 10, and a channel section 13 arranged with clearance from the basic grid element 10, with a flexible section 17 formed in between. Also provided is a contact strip 18. In this embodiment of the contact board, only a single channel section 13 and a single contact strip 18 are provided. This contact board 3 therefore extends from the end face 21 of the support plate 2 only over one of the two side faces of the support plate 2 to the step 7. In other respects the design and function of a module with this contact board 3 correspond to the module 1 described above.

In the embodiment shown in FIG. 6 it is a disadvantage that all conductor paths are led via a flexible circuit board 8 to one side of the basic grid element 10, so that the density of the conductor paths in the flexible circuit board is significantly greater than in the embodiment shown in FIG. 5. It may therefore also be expedient, in the case of a one-sided arrangement of the contact board 3 relative to the support plate 2, to provide two or more flexible circuit boards superimposed on one another. In this way the density of the conductor paths may be reduced.

The invention has been explained above with the aid of an embodiment. Within the scope of the invention, various modifications are possible. Thus e.g. it is not necessary for the contact board 3 to be bonded to the support plate 2 over its whole surface. Other types of connection, such as screws or rivets are also possible. In the present embodiment the support plate 2 is made of steel and is capable of absorbing considerable forces. For smaller testers in which such high forces do not occur, materials with less strength than steel may also be used for the support plate. Instead of steel a similarly rigid composite material may also be used. In particular it may also be expedient for the support plate to be in the form of a circuit board, with the interconnection of the contact points taking place in the support plate. Interconnection of the conductor paths may also be effected in an interconnection board which is separate from the contact board 3. Such an interconnection board is a circuit board having on one side face contact points which are in electrical contact with corresponding contact points of the contact board. Such an embodiment has the advantage that the interconnections of the individual contact points may be arranged differently by replacing the interconnection board.

Figure 7:
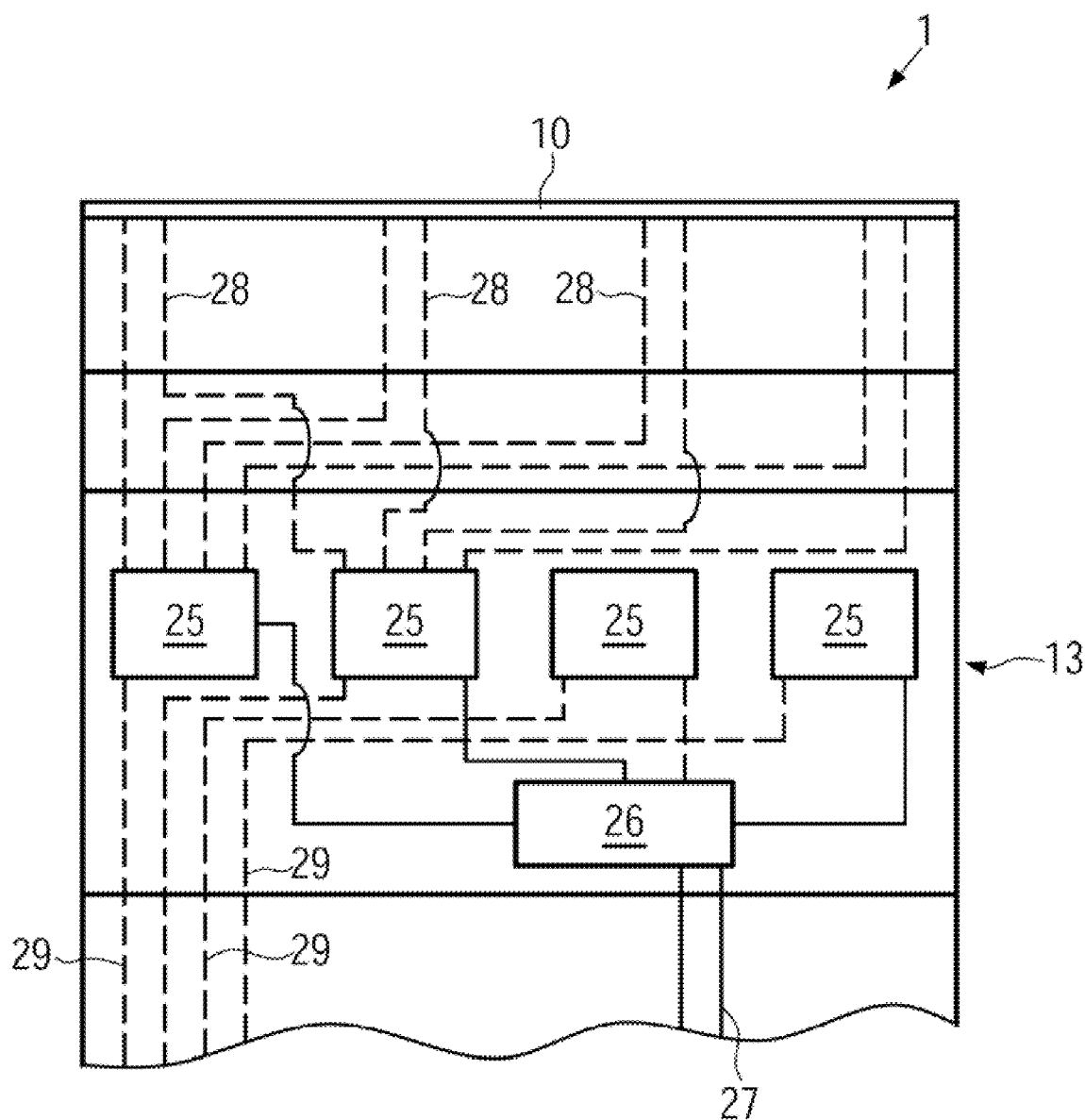
FIG. 7 is a side view of another example of a module.

The diversion of the conductor paths by means of the flexible circuit board 8, from the basic grid element 10 into the vertical direction, provides a great deal of space so that not only interconnection but also complex circuitry is possible in the area of the channel sections 13. FIG. 7 shows a relevant example of a module 1 with a basic grid element 10 in side view. Physically the module is designed as in the embodiment described above. Located in the channel section 13 is a multilayer rigid circuit board which allows complex circuitry. This circuitry comprises four multiplexers 25 and a control element 26 which is a logic module. The control element 26 is connected to the evaluation electronics via a data line 27. The data line 27 is preferably in the form of a data bus which is guided through all modules of a tester and through which the individual control elements 26 may be controlled by the evaluation electronics.

The control element in turn controls the multiplexer 25. In the present embodiment, four multiplexers 25 are provided. Each multiplexer 25 is connected by means of conductor paths 28 (to simplify the illustration only a few conductor paths 28 are shown) to the contact points 9 of the basic grid element 10.

The conductor paths 28 which are connected to a multiplexer 25 are divided into n groups, with each multiplexer being able in each case to switch all conductor paths 28 of a group through to corresponding output conductor paths 29. The output conductor paths 29 lead on to the evaluation electronics.

The control element 26 controls which of the n groups of conductor paths 28 and contact points 9 respectively are connected through by the relevant multiplexer 25 to the output conductor paths 29. Also by this means the number of outputs (output conductor paths 29) of a module may be reduced considerably as compared with the number of contact points 9. Such an arrangement has the advantage that there are no permanent interconnections between individual contact points, but instead each contact point may be switched through individually to a connection of the evaluation electronics.

In principle a single multiplexer would be sufficient to reduce the number of output conductor paths relative to the number of contact points. It is however expedient to use several multiplexers which may be activated independently of one another by the control element 26, since no measurement is possible between contact points 9 connected to conductor paths 28 and belonging to different groups of a common multiplexer, because two such contact points may not be connected simultaneously to the output conductor paths. If several multiplexers 25 are provided then the number of contact points per group is smaller. This reduces the problem concerned, since contact points connected to different multiplexers 25 may always be tested with one another irrespective of the group to which they belong, since they can be connected simultaneously to output conductor paths 29. Moreover, skilful assignment of the contact points of the basic grid to the relevant circuit board test points of a circuit board to be tested makes it possible to avoid the situation in which two circuit board test points between which a measurement should be made are connected to conductor paths 28 belonging to different groups of a common multiplexer 25. This assignment may be obtained through an inclined positioning of test needles in an adapter lying on the basic grid, as already known from EP 0 875 767 A2.

Using this module, several groups of contact points of the basic grid element 10 may be connected through and measured individually by the evaluation electronics via the data line 27. This creates a highly flexible system of measurement which, in view of the large number of contact points, is achieved by a relatively small measurement electronics unit.

The control element 26 may also be programmed so that it automatically switches the multiplexers 25 between all modules in accordance with a predetermined measuring cycle, which is either transmitted over the data line 27 or has been synchronized once in advance.

The switching mechanism shown in FIG. 7 represents an independent inventive concept which may also be realized via the flexible circuit board independently of the link to the basic grid element.

The embodiments of modules for a tester described above have a basic grid element on which the contact points of the basic grid are arranged at a density of 124 contact points per square centimeter. The combination of the strip-shaped basic grid element formed by a rigid circuit board section, combined with the flexible circuit board section in which are guided the conductor paths in contact with the contact points of the basic grid element, provides much space in a simple manner through the deflection into the vertical relative to the basic grid, so that a large number of contact points of the basic grid may be connected reliably to the evaluation electronics. Preferably two flexible circuit board sections are provided, each containing some of the conductor paths. In a preferred embodiment, the conductor paths contained in the flexible circuit board sections are specifically connected electrically by means of scan channels, so that the necessary connections of the evaluation electronics are reduced.

A further advantageous variant of the invention lies in the combination of the basic grid element, the flexible circuit board section connected to it, and the support plate made of a high-strength material such as for example steel or a suitably strong composite material, so that both the mechanical load generated by the multiplicity of contact points and also the electrical connections may be dealt with reliably.

In the descriptions of the embodiments, the directions top and bottom have been used. Top means the direction towards the basic grid, and bottom means the direction away from the basic grid. The module according to the invention is provided for a tester for the testing of non-componented circuit boards, which are usually tested on the top and bottom simultaneously, so that the tester has two opposite basic grid arrays which are moved together by a press. A circuit board to be tested lying in between comes under pressure from contact elements from above and below between the basic grid arrays and where applicable between intermediate adapters and translators. For the modules mounted above the circuit board, the directions "bottom" and "top" are of course to be reversed accordingly.

The aspects of the invention may be summarized briefly as follows:

A module for a tester for the testing of circuit boards: Such testers have a basic grid on which an adapter and/or a translator may be arranged in order to connect contact points of the basic grid with circuit board test points of a circuit board to be tested. The module comprises a support plate and a contact board. The contact board is formed by a rigid circuit board section which is described as the basic grid element, and at least one flexible circuit board section. Provided on the basic grid element are contact points which each form part of the contact points of the basic grid. The basic grid element is mounted at an end face of the support plate, and the flexible circuit board section is bent in such a way that at least part of the other section of the contact board is parallel to the support plate. Each of the contact points of the basic grid element is in electrical contact with conductor paths running in the contact board and extending from the basic grid element into the flexible circuit board section.

LIST OF REFERENCE NUMBERS 1 module
2 support plate
3 contact board
4 side face of the support plate
5 recess
6 web
7 step
8 flexible circuit board
9 contact point
10 basic grid element
11 rigid circuit boards
12 rigid circuit boards
13 channel section
14 conductor path
15 scan channel
16 via hole
17 flexible section
18 contact strip
19 contact strip
20
21 end face
22 circuit board
23 integrated circuit
24 supports 25 multiplexer
26 control element
27 data line
28 conductor path
29 output conductor path While this invention has been particularly shown and described with references to preferred embodiments thereof, it will be understood by those skilled in the art that various changes in form and details may be made therein without departing from the scope of the invention encompassed by the appended claims.

What is claimed is:

1. A module for a tester for testing circuit boards, wherein the tester has a grid on which an adapter and/or a translator may be arranged in order to connect contact points of the grid with circuit board test points of a circuit board to be tested, and the module includes a support plate and a contact board, wherein the contact board is is comprised of a rigid circuit board section which is described as a grid element, at least one flexible circuit board section, and a third section with the at least one flexible circuit board section connecting the grid element to the third section, and the grid element is a portion of the grid and provided on the grid element are contact points which each form part of the contact points of the grid and are arranged with a density of at least 100 contact points per square centimeter, and the grid element is mounted at right-angles to a plane of the support plate at an end face of the support plate, and the flexible circuit board section is bent to connect to the third section of the contact board, which is roughly parallel to the plane of the support plate, wherein each of the contact points of the grid element is in electrical contact with conductor paths running in the contact board and extending from the grid element into the flexible circuit board section.

2. A module according to claim 1, wherein the rigid circuit board section of the contact board is mounted on and connected to an area of the at least one flexible circuit board section and the contact points are electrically connected by via holes to the conductor paths running in the flexible circuit board.

3. A module according to claim 1, wherein the rigid circuit board section of the grid element is elongated and strip-shaped.

4. A module according to claim 2, wherein the rigid circuit board section of the grid element is elongated and strip-shaped.

5. A module according to claim 1, wherein the contact board has two flexible circuit board sections, wherein the grid element is arranged between the two flexible circuit board sections.

6. A module according to claim 1, wherein specific contact points of the grid element are electrically interconnected.

7. A module according to claim 6, wherein electrical connections between the specific contact points are formed in the contact board.

8. A module according to claim 7, wherein each contact point is electrically connected to at least one other contact point, while the electrically interconnected contact points form groups of at least two, three, four or five electrically interconnected contact points.

9. A module according to claim 6, wherein the conductor paths of the contact board are electrically interconnected with corresponding conductor paths of the support plate, and the electrical connections between the circuit board test points are formed in the support plate.

10. A module according to claim 9, wherein the support plate is provided with a matrix of conductor paths running at right-angles to one another, while at certain crossovers of these conductor paths via holes are formed in such a way that the contact points of the grid element are electrically interconnected.

11. A module according to claim 1, wherein the contact points of the grid element are arranged in two square grids interlaced with each other and the contact points are regularly spaced from one another forming a grid.

12. A module according to claim 1, wherein the density of the contact points of the grid element is at least 120 contact points per square centimeter.

13. A module according to claim 1, wherein the support plate is made of a rigid material, such as for example steel or a composite material, and that at each end of the module a piece protrudes to form supports by which the module may be laid on suitable support rails of a tester, so that the compressive force exerted on the grid element is transferred to the support rails.

14. A module according to claim 1, wherein the support plate is designed to absorb a pressure of at least 25 N/cm$^2$ on the grid element.

15. A module for a tester for testing of circuit boards, wherein the tester has a grid on which an adapter and/or a translator may be arranged in order to connect contact points of the grid with circuit board test points of a circuit board to be tested, and the module includes a support plate and a contact board, wherein the contact board is formed by a rigid circuit board section which is described as a grid element and at least one flexible circuit board section, and the grid element is a portion of the grid and provided on the grid element are contact points which each form part of the contact points of the grid and are arranged with a density of at least 100 contact points per square centimeter, and the basic grid element is mounted at right-angles to a plane of the support plate at an end face of the support plate, and the flexible circuit board section is bent in such a way that at least part of the other section of the contact board is roughly parallel to the support plate, wherein each of the contact points of the basic grid element is in electrical contact with a conductor path running in the contact board and extending from the basic grid element into the flexible circuit board section;

wherein specific contact points of the basic grid element are electrically interconnected;

wherein electrical connections between the specific contact points are formed in the contact board; and wherein the contact board has at least one further rigid circuit board section which is described as a channel section and is arranged roughly parallel to the support plate, and in which the electrical connections between conductor paths are formed.

16. A module according to claim 15, wherein the channel section has several conductor paths, running at right-angles to the conductor paths connected to the contact points of the grid element, which are described as scan channels, and the conductor paths connected to the circuit board test points are so connected via holes that the circuit board test points are electrically interconnected.

17. A module for a tester for testing of circuit boards, wherein the tester has a grid on which an adapter and/or a translator may be arranged in order to connect contact points of the grid with circuit board test points of a circuit board to be tested, and the module has a support plate and a grid element is formed by a rigid circuit board section, wherein the grid element has contact points which each form part of the contact points of the grid and the grid element is mounted at right-angles to a plane of the support plate at an end face of the support plate, and roughly parallel to the plane of the support plate there is provided a circuit board on which are formed conductor paths, each of which is in contact with one of the contact points of the grid element, and on this circuit board is mounted at least one multiplexer, wherein the multiplexer is connected to several groups of the conductor paths, each of which is in contact with one of the contact points, wherein the at least one multiplexer connects one of these groups of conductor paths through to a group of corresponding output conductor paths, wherein the output conductor paths lead to evaluation electronics.

18. A module according to claim 17, wherein several multiplexers are provided.

19. A module according to claim 17, wherein a control element is connected to the evaluation electronics over a data line, so that the assignment of groups of conductor paths which are connected to the output conductor paths may be varied by the evaluation electronics.

20. A module for a tester for the testing of circuit boards in which the tester has a grid for receiving an adapter and/or a translator in order to connect contact points of the grid with circuit board test points of a circuit board to be tested, the module comprising:
  a support plate; and
  a contact board,
    wherein the contact board is comprised of a rigid circuit board section that functions as a grid element, at least one flexible circuit board section and a third section with the at least one flexible circuit board section connecting the grid element to the third section, and the grid element is a portion of the grid and provided on the grid element are contact points which each form part of the contact points of the grid and are arranged with a density of at least 100 contact points per square centimeter, and
    wherein the grid element is mounted at right-angles to a plane of the support plate at an end face of the support plate, and the flexible circuit board section is bent to connect to the third section, which is roughly parallel to the plane of the support plate, wherein the contact points of the grid element are in electrical contact with conductor paths running in the contact board and extending from the grid element into the flexible circuit board section.

21. A module for a tester for testing circuit boards, wherein the tester has a grid on which an adapter and/or a translator arranged to connect contact points of the grid with circuit board test points of a circuit board to be tested, wherein the module includes:
  a support plate; and
  a contact board comprised of:
    a grid element that forms a portion of the grid and has contact points with a density of at least 100 contact points per square centimeter, the grid element being mounted at right-angles to a plane of the support plate at an end face of the support plate, and
    at least one flexible circuit board section that connects to the grid element, a portion of the flexible circuit board section being roughly parallel to the plane of the support plate, wherein contact points of the grid element are in electrical contact with conductor paths running in the at least one flexible circuit board section and the contact points of the grid element are electrically interconnected in the at least one flexible circuit board section.

\* \* \* \* \*